(12) United States Patent
Koyata et al.

(10) Patent No.: US 7,456,106 B2
(45) Date of Patent: *Nov. 25, 2008

(54) METHOD FOR PRODUCING A SILICON WAFER

(75) Inventors: Sakae Koyata, Tokyo (JP); Kazushige Takaishi, Tokyo (JP); Tohru Taniguchi, Tokyo (JP); Kazuo Fujimaki, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 201 days.

This patent is subject to a terminal disclaimer.

(21) Appl. No.: 10/957,026

(22) Filed: Oct. 1, 2004

(65) Prior Publication Data

US 2005/0148181 A1   Jul. 7, 2005

(51) Int. Cl.
*H01L 21/00* (2006.01)
*B44C 1/22* (2006.01)

(52) U.S. Cl. ............... 438/692; 216/52; 216/88; 438/460; 438/690; 438/691; 438/745

(58) Field of Classification Search ............ 216/52, 216/88, 89; 438/460, 745, 692
See application file for complete search history.

(56) References Cited

U.S. PATENT DOCUMENTS

| 5,942,445 | A * | 8/1999 | Kato et al. ............ 438/691 |
| 5,963,821 | A * | 10/1999 | Kai et al. ............ 438/460 |
| 6,743,698 | B2 * | 6/2004 | Ushiki et al. ............ 438/460 |
| 2001/0039119 | A1 * | 11/2001 | Kishimoto ............ 438/690 |
| 2003/0022495 | A1 * | 1/2003 | Netsu et al. ............ 438/689 |
| 2004/0081805 | A1 * | 4/2004 | Furihata et al. ............ 428/192 |
| 2005/0112893 | A1 * | 5/2005 | Koyata et al. ............ 438/692 |

* cited by examiner

*Primary Examiner*—Shamim Ahmed
(74) *Attorney, Agent, or Firm*—Duane Morris LLP

(57) ABSTRACT

Provided is a method for producing a silicon wafer whose surfaces exhibit precise flatness and minute surface roughness, and which allows one to visually discriminate between the front and rear surfaces, the method comprising a slicing step of slicing a single-crystal ingot into thin disc-like wafers, a chamfering step of chamfering the wafer, a lapping step for flattening the chamfered wafer, a mild lapping step for abrading away part of processing distortions on the rear surface of the wafer left after chamfering and lapping, a rear-surface mild polishing step for abrading away part of roughness on the rear surface of the wafer, an etching step for alkali-etching the remains of processing distortions on the front and rear surfaces of the wafer, a front-surface mirror-polishing step for mirror-polishing the front surface of the etched wafer, and a cleaning step for cleaning the mirror-polished wafer.

5 Claims, 3 Drawing Sheets

(a)

27

The rear surface of a wafer after mild lapping (b)

27

The rear surface of the same wafer after rear-surface mild polishing

METHOD FOR PRODUCING A SILICON WAFER

BACKGROUND OF THE INVENTION

1. Field of the Invention

The present invention provides a method for producing a silicon wafer whereby it is possible to fabricate a wafer both of whose surfaces exhibit a high precision flatness and minute surface roughness, and which allows one to visually discriminate between the front and rear surfaces of the wafer.

2. Description of the Related Art

The conventional method for producing a semiconductor silicon wafer comprises the steps of separating a silicon block from a silicon single-crystal ingot pulled upward, slicing the silicon block to produce wafers, subjecting the wafer to chamfering, mechanical polishing (lapping), etching and mirror polishing (polishing), and cleaning the wafer. Thus, a wafer is obtained that has a high precision flatness. The steps constituting the conventional method may be modified in various manners depending on given purposes: some foregoing steps may be exchanged in order for other later steps; a certain step may be repeated two or more times; a heating step or a scraping step may be added or put in the place of an existent step. A wafer having undergone mechanical processing such as block separation, peripheral abrasion, slicing, lapping, etc., suffers from processing deformations on its surfaces, or has degraded superficial layers which may cause, in later processing, crystallization defects such as slip dislocations or the like, thereby lowering the mechanical strength of the wafer, or exerting adverse effects on the electrical properties of the wafer. Therefore, superficial layers containing such processing distortions must be thoroughly eliminated from the wafer. Usually, to eliminate such superficial layers, the wafer is subjected to etching treatment. The etching treatment can be classified into acid etching based on an acid etching solution comprising mixed acid, and alkali etching based on an alkali etching solution comprising alkali such as NaOH.

As for acid etching, its etching rate on the surface of a wafer markedly varies depending on the species of reactive molecules and concentration gradients of reaction products because the dispersive layer of the etching solution in contact with the wafer surface fluctuates in its thickness as a result of non-uniform flow of the etching solution etc. Therefore, the uniform flatness of the surface obtained as a result of lapping may be damaged during etching, and undulations having an amplitude of the order of a millimeter (mm) or indentations called peel may develop on the surface.

On the other hand, the etching rate in alkali etching is not affected by the species of reactive molecules and concentration gradients of reaction products, and thus the uniform flatness of the surface obtained as a result of lapping is retained even after etching. As long as the obtainment of a wafer having surfaces with a high flatness is concerned, etching based on alkali solution is better than the acid-based counterpart. However, when a wafer is subject to alkali etching, pits (to be called facets hereinafter) having a diameter of several to a few tens micrometers ($\mu m$) and a depth of several micrometers ($\mu m$) may be formed on the surfaces depending on the orientation of crystal there. In alkali etching, the etching rate greatly differs according to the direction of etching with respect to the orientation of crystal, e.g., etching rates in the crystal directions <100>, <110> and <111> are widely different from each other, namely, the ratios of etching rate among the crystal directions <100>, <110> and <111> are widely different (crystal anisotropy). This crystal anisotropy is responsible for the development of facets in alkali etching. The flaw characteristic with alkali etching includes not only facets but also deep pits having a diameter of several micrometers ($\mu m$) or less, and a depth of ten to a few tens micrometers ($\mu m$). If there is a dot-like local flaw or stain on the front surface of a wafer, the dot-like flaw will cause reaction to proceed abnormally which may result in the development of a deep pit.

The condition of the rear surface of a wafer after etching is retained until the wafer is processed into a device. Because of this, a problem mentioned below will arise.

When the rear surface of a wafer is attached to a sucking plate for photolithography in order to fabricate a device from the wafer, undulations having an amplitude of the order of a millimeter (mm) of the rear surface formed as a result of acid-based etching are transmitted as they are to the front surface, and the undulations transmitted to the front surface degrade the resolution of patterned light incident thereupon, which will in the end cause the yield of devices produced to be reduced.

On the other hand, when the rear surface of a wafer having undergone alkali-based etching is attached to a sucking plate for photolithography, the sharp, ragged edges of facets and pits formed on the rough surface of the wafer are tipped off to be scattered into air to produce numerous particles which may cause the lowered yield of device production. A wafer having undergone alkali-based etching causes the development of dust consisting of 4000-5000 particles, and a wafer etched with acid solution is responsible for the development of dust consisting of 2000 particles. In contrast, a wafer both of which surfaces have been mirror-polished evokes scarcely any particle, and does not cause the development of dust.

Thus, if both surfaces of a wafer are mirror-polished, its rear surface will have no coarse roughness that may cause the development of dust, and no undulations with an amplitude of the order of a millimeter (mm) will be evoked. This will ensure the high degree flatness of the surface. In short, such a wafer will be relieved of the problems caused by etching.

However, a new problem arises in relation to the mirror-polished wafer. If both surfaces of a wafer are mirror-polished, not only its front surface but its rear surface also have a mirror surface. A wafer detecting sensor commonly used in the conveyor unit of a device processing system detects the presence of a wafer by receiving light scattered from the rear surface of the wafer. Therefore, if the rear surface of a wafer has as smooth a surface as the front surface, the detecting sensor could hardly detect the wafer which will lead to the increased occurrence of erroneous detection.

SUMMARY OF THE INVENTION

The object of the present invention is to provide a method for producing a silicon wafer whereby it is possible to fabricate a wafer both of whose surfaces exhibit a high precision flatness and minute surface roughness, and which allows one to visually discriminate between the front and rear surfaces of the wafer.

To achieve the object, as shown in FIG. 1, the method according to claim 1 for producing a silicon wafer comprises a slicing step 10 of slicing a single-crystal ingot into thin disc-like wafers, chamfering step 11 of chamfering the wafer obtained from the slicing step 10, lapping step 12 for flattening the chamfered wafer by abrading it, mild lapping step 13 for abrading away part of processing distortions produced on the rear surface of the wafer as a result of chamfering and lapping, rear-surface mild polishing step 14 for abrading away part of roughness on the rear surface of the mildly lapped wafer, etching step 16 for etching away with alkali solution the remains of processing distortions on the front and rear surfaces of the wafer, front-surface mirror-polishing step 17 for mirror-polishing the front surface of the etched wafer, and cleaning step 18 for cleaning the mirror-polished wafer.

According to the method described in claim 1, during the mild lapping step 13, part of the processing distortions on the rear side of a wafer is eliminated, and during the rear-surface mild polishing step 14 subsequent to the mild lapping step 13, part of roughness of the rear surface of the wafer is eliminated. Then, the wafer is subjected to alkali etching so that residual processing distortions can be eliminated. Accordingly, the thickness of superficial layers to be removed by etching becomes smaller with the method of the invention than with the conventional method, and thus if any facets develop on the rear surface, their size will be larger and their number smaller, which will lead to the reduction of deep pits, and thus the high degree flatness of both surfaces of the wafer achieved by lapping can be maintained more reliably, and it is possible to obtain a wafer which allows one to visually discriminate between its front and rear surfaces.

BRIEF DESCRIPTION OF THE DRAWINGS

FIG. 2(*b*) is an enlarged sectional view of a part of interest of the rear surface of a wafer showing the condition of the wafer subsequent to mild polishing.

DESCRIPTION OF THE PREFERRED EMBODIMENTS

Next, the embodiments of the invention will be described with reference to accompanying drawings.

Figure 1:
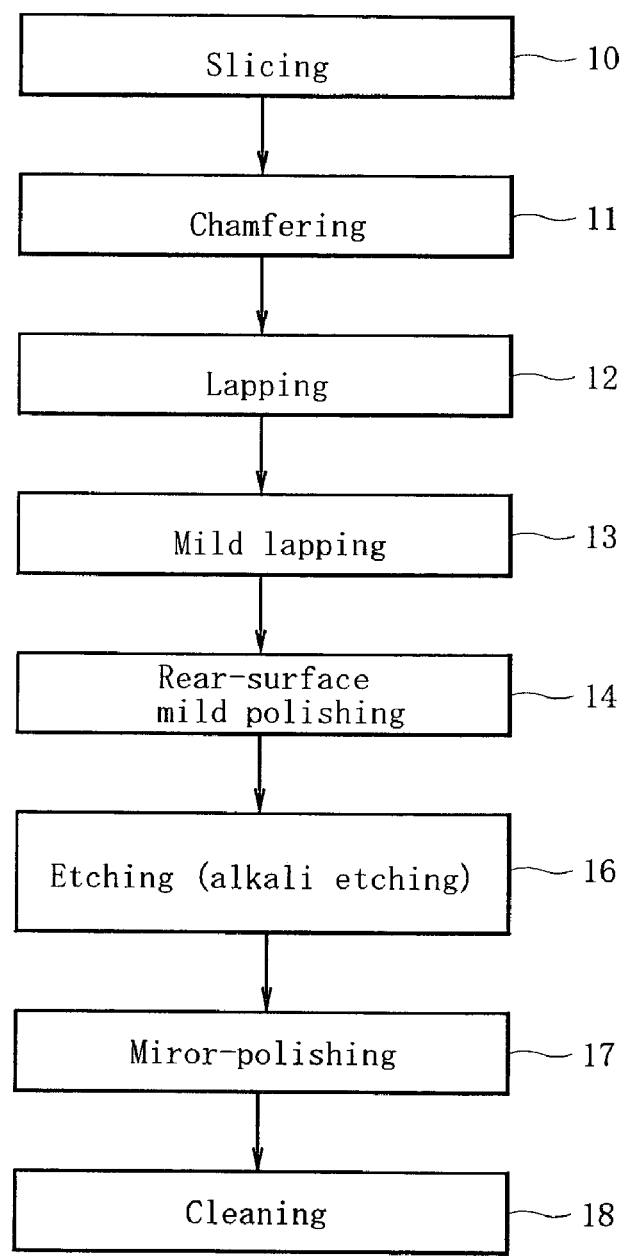
FIG. 1 is a flowchart of the steps constituting the method of the invention for producing a silicon wafer.

At first, a single-crystal silicon ingot grown has its front and rear ends removed to produce a silicon cylindrical mass. Then, to make the cylindrical mass uniform in its diameter, the periphery of the silicon mass is scraped to give a silicon block body having a uniform diameter. An orientation flat or orientation notch is formed on the block body to indicate the orientation of crystal in the block. After the processing, as shown in FIG. 1, the block body is sliced with a specified angle with respect to the central axis of the block body (step 10).

Each wafer obtained as a result of slicing is chamfered on its periphery to prevent the development of notches and flaws there (step 11). This chamfering step can prevent the occurrence of crown phenomenon or the abnormal development of an annular ridge which would otherwise occur along the periphery of a wafer when the front surface of the wafer is subject to epitaxial molecular deposition.

Then, the wafer obtained from the slicing step 10 is mechanically abraded (lapped) so that its surface roughness can be smoothened and the flatness of each surface and the parallelism of both surfaces can be improved (step 12). The wafer having undergone the lapping step 12 is washed and transferred to a next step.

The wafer having superficial layers comprising processing distortions introduced during the chamfering step 11 and lapping step 12 on in its surfaces are subjected to mild lapping to eliminate part of those distortions (step 13). Through this mild lapping process 13, not only the parallelism (flatness) of both surfaces of the wafer mainly achieved by the lapping process 12 is maintained, but part of the processing distortions formed on the surfaces of the wafer as a result of the slicing and lapping processes 10 and 12 is also removed. For this mild lapping step 13, for example, a slurry of grinding particles consisting of $Al_2O_3$ or $SiO_2$ with a diameter of 0.05-0.1 μm is applied on the rear surface of the wafer while the wafer is being kept under a specified processing pressure. The mild lapping process 13 is adjusted such that the thickness of a superficial layer removed by the process is in the range of 0.1 to 1.0 μm. This is because: if the thickness in question were below 0.1 μm, all remaining processing distortions must be removed at the succeeding etching step 16 which would cause the development of facets and deep pits on the rear surface of the wafer, and, on the contrary, if the thickness in question were made beyond 1.0 μm, the lapping effect would be invariable. On the rear surface of the wafer after the mild lapping step 13, roughness will be reduced, although the residual processing distortions remain as seen from FIG. 2(*a*).

Figure 2:
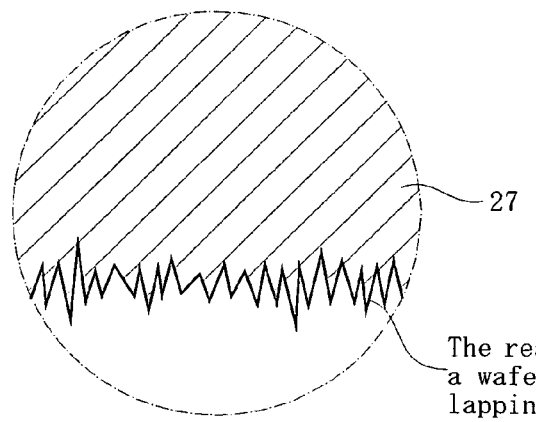
FIG. 2(*a*) is an enlarged sectional view of a part of interest of the rear surface of a wafer showing the condition of the wafer after mild lapping.
Figure 2:
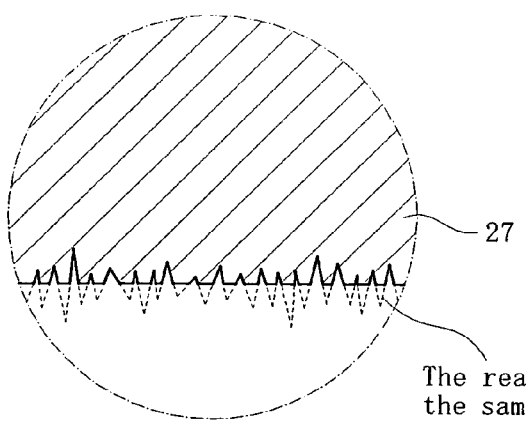

Next, as shown in FIG. 1, a rear-surface mild polishing step is introduced to abrade away part of roughness produced on the rear surface as a result of mild lapping (step 14). As shown in FIG. 2(*b*), applying the rear-surface mild polishing enables the reduction of roughness produced on the rear surface of the wafer.

Figure 3:
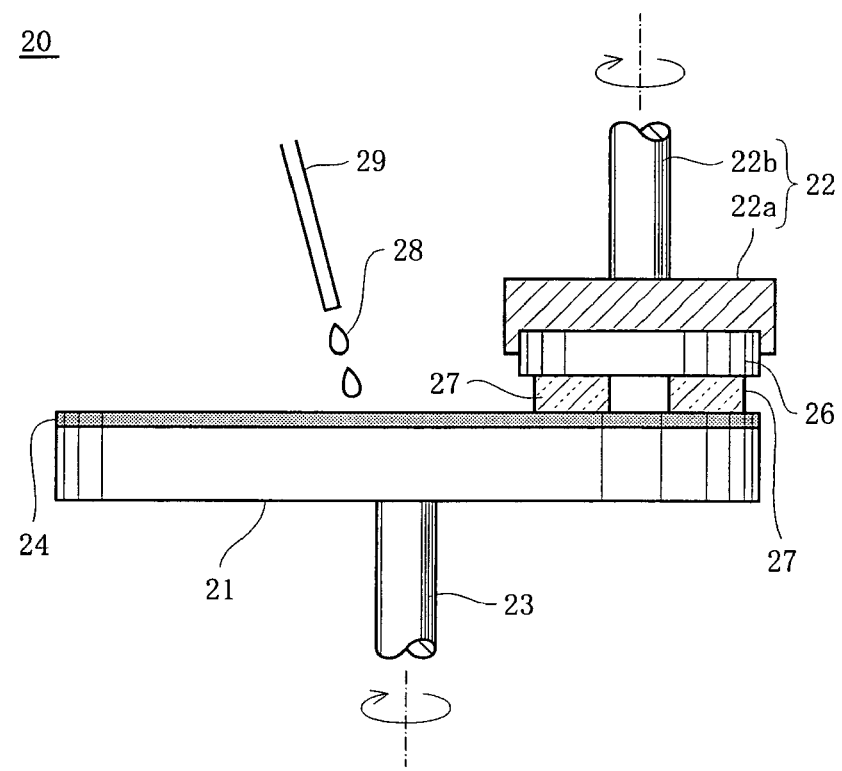
FIG. 3 is a schematic diagram of a unilateral abrading apparatus used for rear-surface mild polishing and front-surface mirror-surface polishing.

A front-surface mirror-polishing step 17, like the rear-surface mild polishing step 14 preceding the step 17, is based on unilateral polishing. The unilateral polishing will be explained with reference to FIG. 3. The abrading apparatus 20 shown in the figure comprises a stabilized rotatory plate 21 and a wafer holding device 22. The stabilized rotatory plate 21 is a large disc plate, and rotates round an axis 23 jointed to the center of its bottom surface. Onto the top surface of the stabilized rotatory plate 21 abrasion cloth 24 is bonded. The wafer holding device 22 comprises a pressurizing head 22*a*, and a shaft 22*b* which is jointed to the pressurizing head 22*a* to transmit rotation thereto. Onto the lower surface of the pressurizing head 22*a* an abrasion plate 26 is attached. Onto the lower surface of the abrasion plate 26 plural sheets of silicon wafer 27 are bonded. A tube 29 is placed over the stabilized rotatory plate 21 to supply abrasion fluid 28 thereto. To abrade the silicon wafer 27 with this abrading apparatus 20, the pressurizing head 22*a* is allowed to descend until it presses the wafer 27 with a specified pressure to stabilize it. With abrasion fluid 28 supplied via the tube 29, the pressurizing head 22 and stabilized rotatory plate 21 are rotated in the same direction, so that a front or rear surface of the wafer 27 is polished to flatness.

The rear surface of a wafer is abraded for 30-45 sec during the rear-surface mild polishing step 14, or the rear-surface mild polishing is performed such that the rear surface of the wafer has a luster of 120-140% after polishing. If the polishing time is less than 30 sec, or the luster of the rear surface after polishing is less than 120%, roughness having a considerably high amplitude would still remain there, and thus if such a wafer is attached to a sucking plate in a later device fabrication process, the roughness on the rear surface of the wafer would be transmitted to the front surface which would cause a disorder. On the contrary, if the polishing time exceeds 45 sec, or the luster of the rear surface after polishing is over 140%, it would be impossible to tell a front surface from a rear surface of the wafer having undergone the front-surface mirror-polishing step 17. After the rear-surface mild polishing process 14, roughness of the rear surface of a wafer is restricted within a specified range as shown in FIG.2(*b*).

The wafer is then subjected to alkali etching, as shown in FIG. 1, in which for the front surface of the wafer processing distortions are removed and for the rear surface of the wafer residual processing distortions are removed, while the surface roughness whose amplitude has been controlled to fall within a specified range during the rear-surface mild polishing step 14 being kept as it is (step 16). The etching solution used in the etching step 16 is based on sodium hydroxide or potassium hydroxide. The total thickness of superficial layers removed from the front and rear surfaces of a wafer during the etching step 16 is 25-30 μm. Preferably, the total thickness of superficial layers removed during the etching step is 25-28 μm. If the total thickness in question were below 25 μm, the luster decreasing effect of etching will become insignificant. On the contrary, if the total thickness in question exceeded 30 μm, aggravated roughness would be so serious as to be problematic.

The wafer having passed the etching step 16 is subjected to front-surface mirror-polishing consisting of mechanical, physical and chemical abrasion in combination. Thus, a wafer is obtained whose front-surface has an optically high luster and suffers from no processing distortions (step 17). The wafer whose front surface is mirror-polished is washed (step 18) and transferred to the device fabrication process. As described above, after having undergone the steps 10 to 18 of the invention, a silicon wafer is obtained both of whose surfaces exhibit a high precision flatness and minute surface roughness, and which allows one to visually discriminate between its front and rear surfaces.

As described above, a wafer, after being passed through the steps of the inventive method, becomes controlled in the smoothness of its surfaces such that its front surface has a higher luster than does the rear surface; both surfaces have a high precision flatness and minute roughness; it will not cause any problem such as poor detectability or detection error when it receives light from a detector monitoring the presence of a wafer while it is carried on a conveyor unit in the later device fabrication process; and its front and rear surfaces appear so different from each other as to allow one to visually discriminate between the two.

What is claimed is:

1. A method for producing a silicon wafer comprising:
   a slicing step of slicing a single-crystal ingot into thin disc-like wafers; and then
   a chamfering step of chamfering the wafer obtained from the slicing step; and then
   a lapping step for flattening the chamfered wafer; and then
   a rear-surface mild lapping step for abrading away part of processing distortions produced on the rear surface of the wafer during the chamfering and lapping steps; and then
   a rear-surface mild polishing step for abrading away part of roughness on the rear surface of the mildly lapped wafer wherein the thickness of the superficial layer removed from the surface during the mild lapping step is from 0.1-1.0 μm; and then
   an etching step for etching away with alkali solution the remains of processing distortions on the front and rear surfaces of the wafer; and then
   a front-surface mirror-polishing step for mirror-polishing the front surface of the etched wafer; and then
   a cleaning step for cleaning the mirror-polished wafer.

2. The method according to claim 1 wherein the time for abrading the rear surface of a wafer at the rear-surface mild polishing step is 30-45 sec, or the rear-surface mild polishing is performed such that the rear surface of the wafer has a luster of 120-140% after polishing.

3. The method according to claim 1 wherein the total thickness of superficial layers on the front and rear surfaces of a wafer removed by alkali etching during the etching step is 25-30 μm.

4. The method according to claim 1 wherein alkali etching solution used in the etching step is based on sodium hydroxide or potassium hydroxide.

5. The method according to claim 3 wherein alkali etching solution used in the etching step is based on sodium hydroxide or potassium hydroxide.

* * * * *

UNITED STATES PATENT AND TRADEMARK OFFICE
CERTIFICATE OF CORRECTION

PATENT NO.       : 7,456,106 B2                                    Page 1 of 1
APPLICATION NO.  : 10/957026
DATED            : November 25, 2008
INVENTOR(S)      : Sakae Koyata et al.

It is certified that error appears in the above-identified patent and that said Letters Patent is hereby corrected as shown below:

Title Page;
(30) Foreign Application Priority Data

Replace the foreign application priority data
"Mar. 22, 2002  (JP)  2002-080867" with
--Mar. 22, 2002  (JP)  2002-080868--.

Signed and Sealed this

Seventh Day of April, 2009

JOHN DOLL
*Acting Director of the United States Patent and Trademark Office*